(12) United States Patent
Fukuda et al.

(10) Patent No.: US 7,859,342 B2
(45) Date of Patent: Dec. 28, 2010

(54) DIFFERENTIAL AMPLIFIER CIRCUIT, OPERATIONAL AMPLIFIER CIRCUIT, LIGHT-RECEIVING AMPLIFIER CIRCUIT USING THE SAME, FUNCTION SELECTION CIRCUIT, AND LIGHT-RECEIVING CIRCUIT USING THE SAME

(75) Inventors: Hideo Fukuda, Kyoto (JP); Shinichi Miyamoto, Takatsuki (JP)

(73) Assignee: Panasonic Corporation, Osaka (JP)

( * ) Notice: Subject to any disclaimer, the term of this patent is extended or adjusted under 35 U.S.C. 154(b) by 194 days.

(21) Appl. No.: 12/230,510

(22) Filed: Aug. 29, 2008

(65) Prior Publication Data
US 2009/0008535 A1    Jan. 8, 2009

Related U.S. Application Data

(62) Division of application No. 11/257,146, filed on Oct. 25, 2005, now Pat. No. 7,466,204.

(51) Int. Cl.
*H03F 3/08* (2006.01)
(52) U.S. Cl. .......................................... 330/308; 330/9
(58) Field of Classification Search .................. 330/59, 330/110, 308, 51, 251; 250/214 A, 214 AG
See application file for complete search history.

(56) References Cited

U.S. PATENT DOCUMENTS

| | | | |
|---|---|---|---|
| 6,166,595 A | 12/2000 | Moldsvar et al. | |
| 6,417,503 B1 * | 7/2002 | Tsuruta | 250/214 A |
| 6,686,603 B2 * | 2/2004 | Ishikawa | 250/214 A |
| 7,116,161 B2 | 10/2006 | Nakahira | |
| 7,180,374 B2 * | 2/2007 | Kim et al. | 330/308 |
| 7,427,738 B2 * | 9/2008 | Sugimoto | 250/214 A |

FOREIGN PATENT DOCUMENTS

| | | |
|---|---|---|
| JP | 03-094505 | 4/1991 |
| JP | 05-029935 | 2/1993 |
| JP | 10-107563 A | 4/1998 |
| JP | 10-177368 | 6/1998 |
| JP | 2001-202646 | 7/2001 |
| JP | 2002-374130 | 12/2002 |

* cited by examiner

*Primary Examiner*—Khanh V Nguyen
(74) *Attorney, Agent, or Firm*—Steptoe & Johnson LLP

(57) ABSTRACT

A differential amplifier circuit, an operational amplifier circuit, and a light-receiving amplifier circuit using the same are provided, by which the influence of an on resistance of an analog switch is reduced during the switching of gain resistances. An NPN transistor Q2 having an emitted connected in common is connected to an NPN transistor Q1 of a differential amplifier circuit including the NPN transistors Q1 and Q3, PNP transistors Q4 and Q5, and a constant-current source I1, and analog switches ASW-1c and ASW-2c are inserted and connected to the collectors of the NPN transistors Q1 and Q2 and connected to the base and collector of the PNP transistor Q4 and the base of the PNP transistor Q5. Further, analog switches ASW-1b and ASW-2b are connected to the bases of the NPN transistors Q1 and Q2, respectively.

5 Claims, 7 Drawing Sheets

F I G. 3
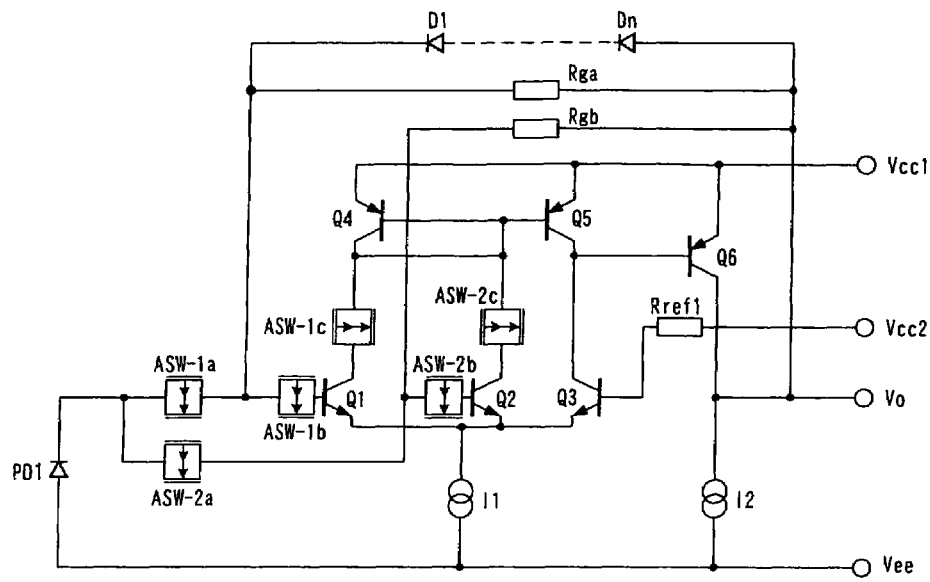
F I G. 4
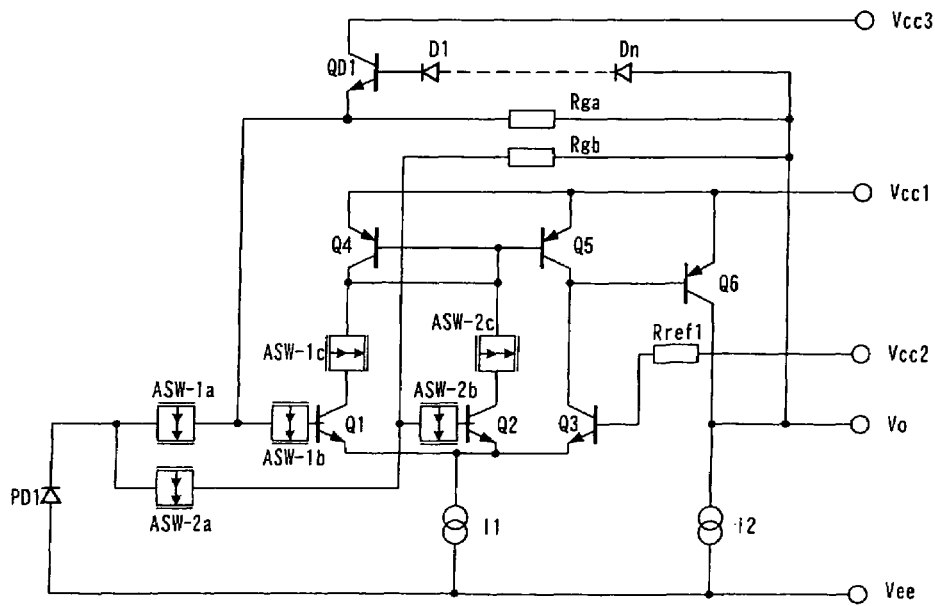

F I G. 7
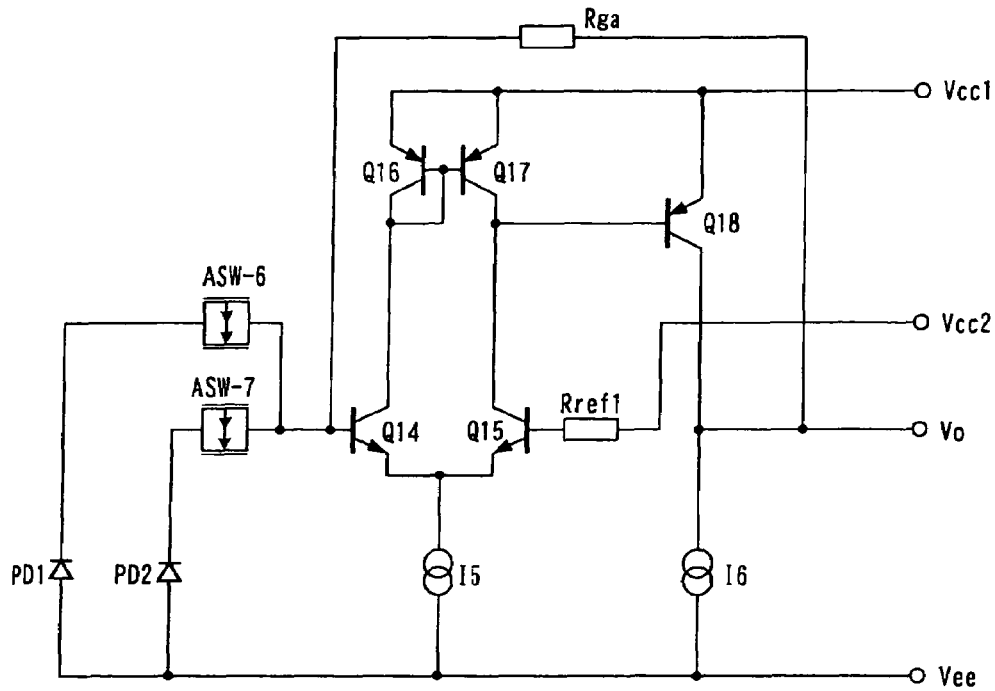
F I G. 8
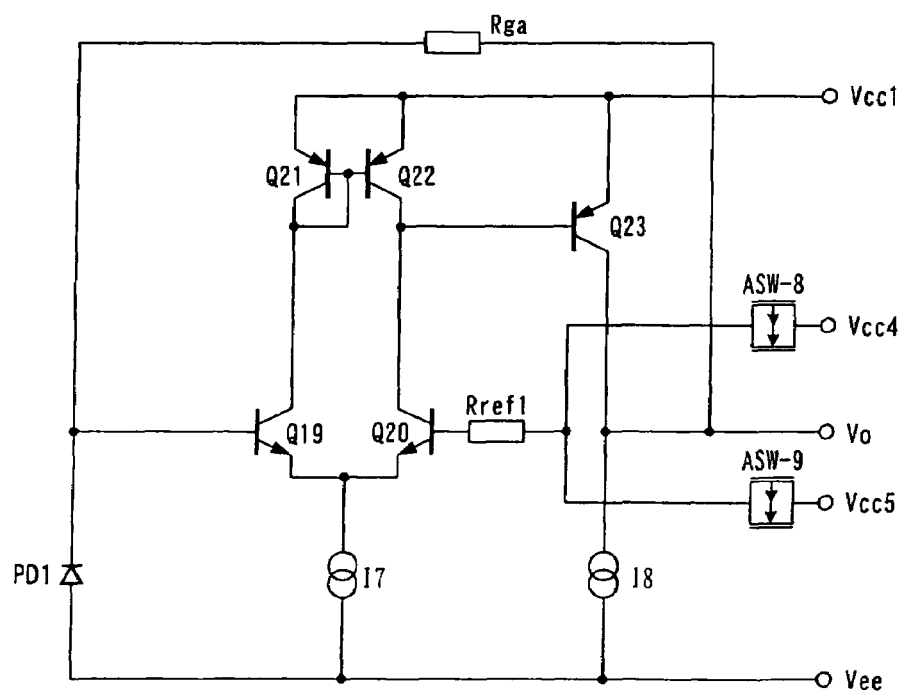

US 7,859,342 B2

DIFFERENTIAL AMPLIFIER CIRCUIT, OPERATIONAL AMPLIFIER CIRCUIT, LIGHT-RECEIVING AMPLIFIER CIRCUIT USING THE SAME, FUNCTION SELECTION CIRCUIT, AND LIGHT-RECEIVING CIRCUIT USING THE SAME

FIELD OF THE INVENTION

The present invention relates to a differential amplifier circuit and an operational amplifier circuit which use analog switches, and relates to a light-receiving amplifier circuit using the same.

BACKGROUND OF THE INVENTION

In response to higher density, higher functionality, and higher speed of semiconductor integrated circuit devices of recent years, the following technique is known: circuits to be operated are selected by turning on/off current supply to functional circuits by means of a switch.

In a light-receiving amplifier circuit used for reading a signal of an optical disk, the optical power of laser is varied between recording and reproduction. Thus, when an optical signal is converted to an electrical signal and amplified, it is necessary to switch the gain resistances of an operational amplifier to set an output voltage within the output dynamic range of the amplifier circuit.

FIG. 12 is a circuit diagram showing a conventional light-receiving amplifier circuit. In this configuration, an operational amplifier having a gain resistance Rga and an operational amplifier having a gain resistance Rgb are connected in parallel, and the operational amplifiers to be operated are switched during recording and reproduction to perform gain control. The operational amplifiers are turned on/off by switching constant-current sources I9 and I10 or I11 and I12, which drive the operational amplifiers, by means of an external switch SW1.

However, the two operational amplifiers are connected in parallel and thus a circuit size increases and the wiring of the circuit is complicated.

Hence, a technique using an analog switch is proposed.

Referring to FIG. 13, the following will discuss JP10-107563A in which a light-receiving amplifier circuit uses an analog switch.

The output of a light-receiving element PD1 is connected to one input of an operational amplifier and simultaneously connected to two gain resistances. The gain resistance Rga is connected directly to the output of the operational amplifier and the other gain resistance Rgb is connected to the output of the operational amplifier via an analog switch ASW-15. During reproduction with low laser optical power, the analog switch ASW-15 is turned off, the gain resistance of the operational amplifier is set only with the gain resistance Rga, and high gain is obtained. Meanwhile, during recording with high laser optical power, the analog switch ASW-15 is turned on, the gain resistance of the operational amplifier is set with the parallel connection of the gain resistance Rga and the gain resistance Rgb, and the gain can be switched to low gain.

However, when turning on the analog switch, because of an on resistance changing with applied current, a parallel or series connection to the gain resistances results in a resistance value changed from the gain resistance having been set in response to an input signal, and an output voltage becomes different from a set value.

In view of this problem, an object of the present invention is to provide a differential amplifier circuit and an operational amplifier circuit which reduce the influence of an on resistance of analog switches, and a light-receiving amplifier circuit using the same.

DISCLOSURE OF THE INVENTION

In order to solve the problem, in a first differential amplifier circuit of the present invention, one input of an input section comprises a plurality of inputs connected in parallel, at least one or more analog switches are connected to each of the plurality of inputs, one of the plurality of inputs is selected by switching the analog switches, and a signal proportionate to a difference between a signal from the one input and a signal from the other input of the input section is outputted.

At least one of the analog switches connected to the plurality of inputs is preferably disposed on a current passage point.

An analog switch is preferably connected to the other input. The analog switch is always turned on.

The analog switch is preferably a CMOS.

A first operational amplifier circuit of the present invention comprises gain resistances and an output section in the first differential amplifier circuit of the present invention, wherein the gain resistance is connected to each of the plurality of inputs, the gain resistance is also connected to the output section, and the gain resistance is selected by switching the analog switches.

A second differential amplifier circuit of the present invention comprises a plurality of input sections connected in parallel, wherein at least one or more analog switches are connected to each of the plurality of input sections, one of the plurality of input sections is selected by switching the analog switches, and a signal proportionate to a difference between two signals inputted to the one of the input sections is outputted.

At least one of the analog switches connected to the plurality of inputs is preferably disposed on a current passage point.

The analog switch is preferably a CMOS.

A second operational amplifier circuit of the present invention comprises gain resistances and an output section in the second differential amplifier circuit of the present invention, wherein the gain resistance is connected to each of the plurality of input sections, the gain resistance is also connected to the output section, and the gain resistance is selected by switching the analog switches.

A third differential amplifier circuit of the present invention, wherein a reference voltage inputted to one of input sections is selected by switching at least one or more analog switches connected to each of a plurality of voltage sources for supplying the reference voltage.

At least one of the analog switches connected to the plurality of voltage sources is preferably disposed on a current passage point.

An analog switch is preferably connected to the other input of the input section. The analog switch is always turned on.

The analog switch is preferably a CMOS.

A third operational amplifier circuit of the present invention comprises gain resistances and an output section in the third differential amplifier circuit of the present invention.

It is preferable that the first and second operational amplifier circuits are disposed between the one of the input sections and the output section and at least one or more diodes are connected in a path connected in parallel with the gain resistances.

It is more preferable that some of the diodes are replaced with at least one or more NPN transistors, the base of the NPN transistor is connected to the anode of the diode, the emitter of the NPN transistor is connected to the cathode of the diode, and the collector of the NPN transistor is set at a higher voltage than the base of the NPN transistor.

A light-receiving amplifier circuit of the present invention comprises at least one or more light-receiving elements connected to one of the inputs of the first to third operational amplifier circuits of the present invention, the light-receiving element converting an optical signal to an electrical signal.

A light-receiving amplifier circuit comprising a plurality of light-receiving elements connected to one input of an operational amplifier circuit, the light-receiving element converting an optical signal to an electrical signal, wherein at least some of the light-receiving elements are connected in parallel, an analog switch is connected to each of the light-receiving elements connected in parallel, and the light-receiving element for outputting a signal to the input is selected by switching the analog switches.

A function selection circuit of the present invention, wherein one of a plurality of functional circuits is selected by switching analog switches respectively connected to the input side and output side of the plurality of functional circuits.

A light-receiving circuit of the present invention comprises at least one or more light-receiving elements connected to the input side of the plurality of functional circuits of the function selection circuit of the present invention, the light-receiving element converting an optical signal to an electrical signal.

The function selection circuit is preferably a differential amplifier circuit.

According to the present invention, the analog switches are used on a circuit part operated by current or the base of a bipolar transistor where almost no current passes through. Thus, it is possible to reduce the influence of the on resistance of the analog switches during the operation of the differential amplifier circuit, thereby obtaining desired characteristics during the selection of functions including gain switching.

BRIEF DESCRIPTION OF THE DRAWINGS

FIG. 3 is a circuit diagram showing a light-receiving amplifier circuit using diodes according to Embodiment 1 of the present invention;

FIG. 4 is a circuit diagram showing another light-receiving amplifier circuit using the diodes according to Embodiment 1 of the present invention;

FIG. 7 is a circuit diagram showing a light-receiving amplifier circuit according to Embodiment 3 of the present invention;

FIG. 8 is a circuit diagram showing a light-receiving amplifier circuit according to Embodiment 4 of the present invention;

DESCRIPTION OF THE EMBODIMENTS

The following will describe embodiments of the present invention in accordance with the accompanying drawings.

Embodiment 1

Figure 1:
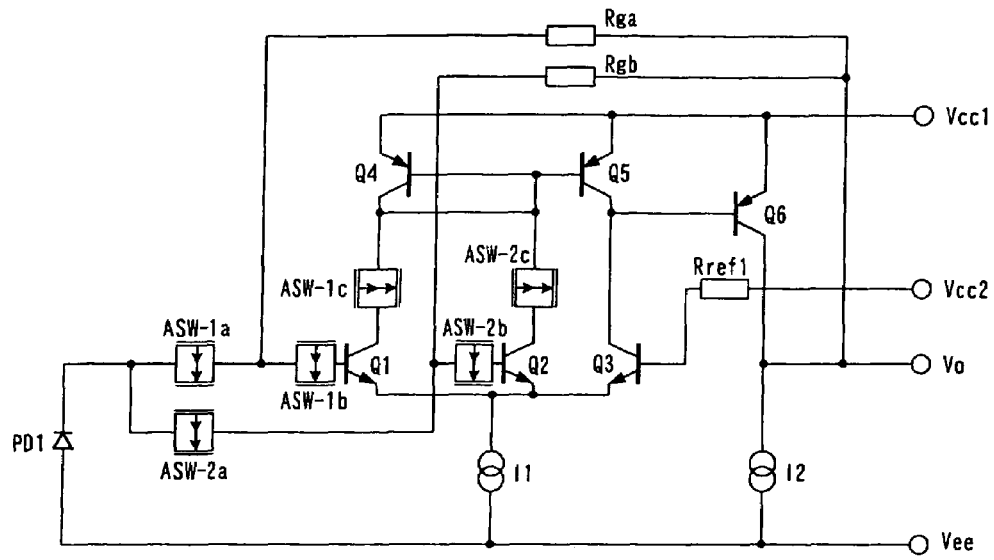
FIG. 1 is a circuit diagram showing a light-receiving amplifier circuit according to Embodiment 1 of the present invention.

FIG. 1 is a circuit diagram showing a light-receiving amplifier circuit according to Embodiment 1 of the present invention.

First, as shown in FIG. 1, a differential amplifier circuit comprises NPN transistors Q1 and Q3, PNP transistors Q4 and Q5, and a constant-current source I1. An NPN transistor Q2 having an emitter connected in common is connected to the NPN transistor Q1 of the differential amplifier circuit. Analog switches ASW-1c and ASW-2c are inserted and connected to the collectors of the NPN transistors Q1 and Q2. The analog switches ASW-1c and ASW-2c are connected to the base and collector of the PNP transistor Q4 and the base of the PNP transistor Q5.

Further, analog switches ASW-1b and ASW-2b are connected to the bases of the NPN transistors Q1 and Q2. When the analog switches ASW-1b and ASW-1c are turned on and the analog switches ASW-2b and ASW-2c are turned off, the differential amplifier circuit comprising the NPN transistors Q1 and Q3, the PNP transistors Q4 and Q5, and the constant-current source I1 is in an operating state.

Conversely, when the analog switches ASW-1b and ASW-1c are turned off and the analog switches ASW-2b and ASW-2c are turned on, a differential amplifier circuit comprising the NPN transistors Q2 and Q3, the PNP transistors Q4 and Q5, and the constant-current source I1 is in an operating state.

An operational amplifier is configured as follows: an analog switch ASW-1a and a gain resistance Rga are connected to the other terminal of the analog switch ASW-1b, an analog switch ASW-2a and a gain resistance Rgb are connected to the other terminal of the analog switch ASW-2b, and a PNP transistor Q6 and a constant-current source I2 are connected as an output stage.

When the analog switches ASW-1a, ASW-1b, and ASW-1c are turned on and the analog switches ASW-2a, ASW-2b, and ASW-2c are turned off, the gain of the operational amplifier is set at the gain resistance Rga. Conversely, when the analog switches ASW-1a, ASW-1b, and ASW-1c are turned off and the analog switches ASW-2a, ASW-2b, and ASW-2c are turned on, the gain of the operational amplifier is set at the gain resistance Rgb.

Further, one terminals of the analog switches ASW-1a and ASW-2a are connected to each other and the terminals and the light-receiving element PD1 are connected in series, so that the light-receiving amplifier circuit capable of switching the gain resistances Rga and Rgb by means of the analog switches is obtained. In other words, on the assumption that the gain resistance Rga has a small resistance value and the gain resistance Rgb has a large resistance value, when the analog switches ASW-1a, ASW-1b, and ASW-1c are turned on and the analog switches ASW-2a, ASW-2b, and ASW-2c are turned off during recording with high incident light power during recording with high incident light power, the light-receiving amplifier circuit has low gain and thus voltage output is within the output dynamic range of the light-receiving amplifier circuit. Conversely, during reproduction with low incident light power, when the analog switches ASW-1a, ASW-1b, and ASW-1c are turned off and the analog switches ASW-2a, ASW-2b, and ASW-2c are turned on, the light-receiving amplifier circuit has high gain and thus voltage output is within the output dynamic range of the light-receiving amplifier circuit.

Figure 2:
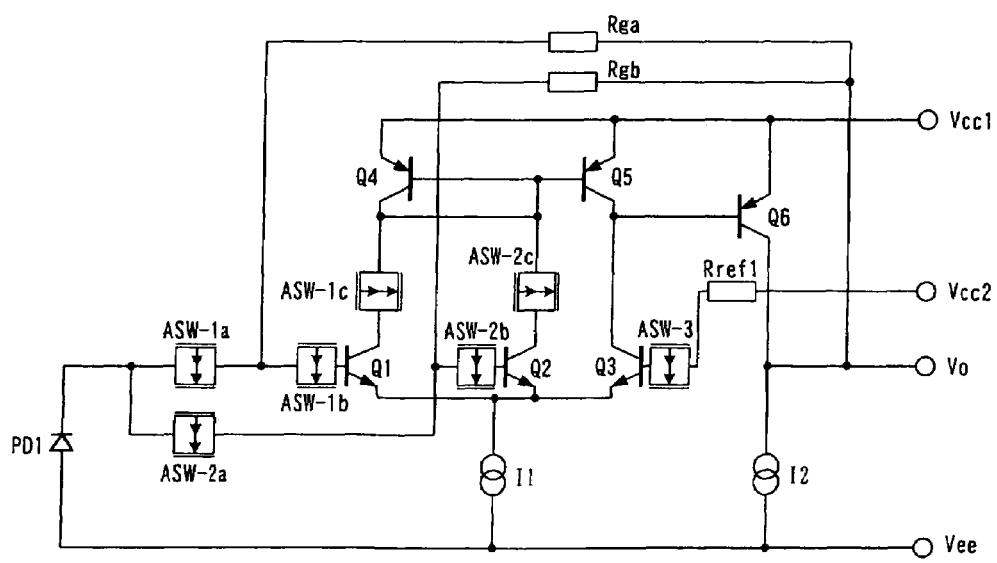
FIG. 2 is a circuit diagram showing another light-receiving amplifier circuit according to Embodiment 1 of the present invention.

FIG. 2 is a circuit diagram showing another light-receiving amplifier circuit according to Embodiment 1 of the present invention.

In the above embodiment, the analog switches ASW-1a, ASW-1c, ASW-2a, and ASW-2c are inserted and connected at current operating points in the circuit, and thus the on resistances of the analog switches are almost negligible. However, a low voltage drop occurs on the analog switches ASW-1b and ASW-2b due to the base currents of the NPN transistors Q1 and Q2 and the on resistances of the analog switches ASW-1b and ASW-2b. Hence, as shown in FIG. 2, an analog switch ASW-3 which is always turned on is inserted and connected to the base of an NPN transistor Q3 serving as an input on the reference voltage side of a differential amplifier circuit, so that the low voltage drop is cancelled.

Since laser light power is high during recording, a clipping circuit is connected in many cases to prevent a circuit from being saturated. FIG. 3 is a circuit diagram showing still another light-receiving amplifier circuit of Embodiment 1. As shown in FIG. 3, n diodes D1 to Dn corresponding to a clipping voltage are connected in parallel with a gain resistance Rga, so that a gain configuration including the clipping circuit can be selected.

In the case of high laser light power, when the clipping circuit comprises the diodes D1 to Dn, the collector current of a PNP transistor Q6 is supplied to the diodes D1 to Dn, and thus the PNP transistor Q6 may have insufficient collector current. FIG. 4 is a circuit diagram showing still another light-receiving amplifier circuit of Embodiment 1. As shown in FIG. 4, diodes making up the clipping circuit are connected to the base of an NPN transistor QD1. The NPN transistor QD1 has a collector connected to a high-voltage Vcc3 and an emitter connected to a gain resistance Rga and analog switches ASW-1a and ASW-1b. Such a connection of the NPN transistor QD1 can reduce the collector current of the PNP transistor Q6.

According to Embodiment 1, in the differential amplifier circuit, the analog switches are inserted and connected to the current operating points of the circuit. Thus, the influence of the on resistances of the analog switches can be reduced and the characteristics of the operational amplifier are less affected. Further, when the dynamic range of a light-receiving signal is adjusted by switching gain resistances, a displacement from a set value can be reduced, thereby designing a light-receiving amplifier circuit with excellent characteristics.

Embodiment 2

Figure 5:
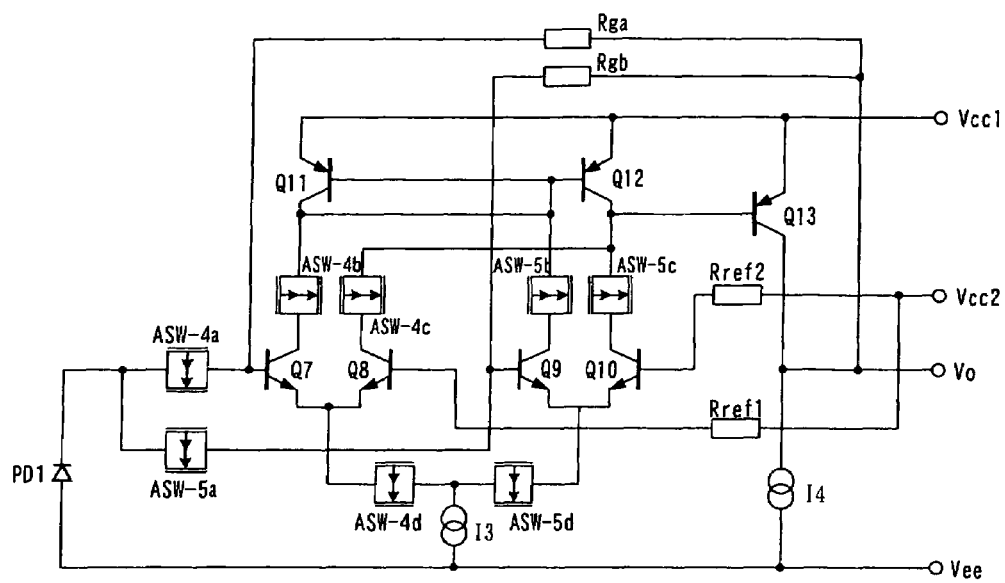
FIG. 5 is a circuit diagram showing a light-receiving amplifier circuit according to Embodiment 2 of the present invention.

As shown in FIG. 5, PNP transistors Q11 and Q12 and a constant-current source I3 are connected in common, a differential amplifier circuit comprising NPN transistors Q7 and Q8 and a differential amplifier circuit comprising NPN transistors Q9 and Q10 are connected in parallel, analog switches ASW-4b, ASW-4c, ASW-5b, and ASW-5c are respectively inserted and connected to the collectors of the NPN transistors Q7, Q8, Q9, and Q10, an analog switch ASW-4d is inserted and connected between a constant current source I3 and the emitters of the NPN transistors Q7 and Q8 of the differential amplifier circuits, and an analog switch ASW-5d is inserted and connected between the constant-current source I3 and the emitters of the NPN transistors Q9 and Q10. When the analog switches ASW-4b, ASW-4c, and ASW-4d are turned on and the analog switches ASW-5b, ASW-5c, and ASW-5d are turned off, the operational amplifier circuit comprising the NPN transistors Q7 and Q8, the PNP transistors Q11 and Q12, and the constant-current source I13 is in an operating state. Conversely, when the analog switches ASW-4b, ASW-4c, and ASW-4d are turned off and the analog switches ASW-5b, ASW-5c, and ASW-5d are turned on, the operational amplifier circuit comprising the NPN transistors Q9 and Q10, the PNP transistors Q11 and Q12, and the constant-current source I3 is in an operating state.

An analog switch ASW-4a and a gain resistance Rga are connected to the base of the NPN transistor Q7, an analog switch ASW-5a and a gain resistance Rgb are connected to the base of the NPN transistor Q9, and a PNP transistor Q13 and a constant-current source I4 are connected as an output stage. Reference resistances Rref1 and Rref2 corresponding to the gain resistances Rga and Rgb are respectively connected to the NPN transistors Q8 and Q10, so that an operational amplifier is configured so as to adjust an output offset voltage according to the gain resistances Rga and Rgb.

When the analog switches ASW-4a, ASW-4b, ASW-4c, and ASW-4d are turned on and the analog switches ASW-5a, ASW-5b, ASW-5c, and ASW-5d are turned off, the gain of the operational amplifier is set at the gain resistance Rga. Conversely, when the analog switches ASW-4a, ASW-4b, ASW-4c, and ASW-4d are turned off and the analog switches ASW-5a, ASW-5b, ASW-5c, and ASW-5d are turned on, the gain of the operational amplifier is set at the gain resistance Rgb.

One terminals of the analog switches ASW-4a and ASW-5a are connected to each other and the terminals and a light-receiving element PD1 are connected in series, so that the light-receiving amplifier circuit is obtained which can switch the gain resistances by means of the analog switches and adjust an output offset voltage according to each gain resistance.

In other words, on the assumption that the gain resistance Rga has a small resistance value and the gain resistance Rgb has a large resistance value, when the analog switches ASW-4a, ASW-4b, ASW-4c, and ASW-4d are turned on and the analog switches ASW-5a, ASW-5b, ASW-5c, and ASW-5d are turned off during recording with high incident light power, the light-receiving amplifier circuit has low gain and thus voltage output is within the output dynamic range of the light-receiving amplifier, circuit.

Conversely, when the analog switches ASW-4a, ASW-4b, ASW-4c, and ASW-4d are turned off and the analog switches ASW-5a, ASW-5b, ASW-5c, and ASW-5d are turned on during reproduction with low incident light power, the light-receiving amplifier circuit has high gain and thus voltage output is within the output dynamic range of the light-receiving amplifier circuit.

Figure 6:
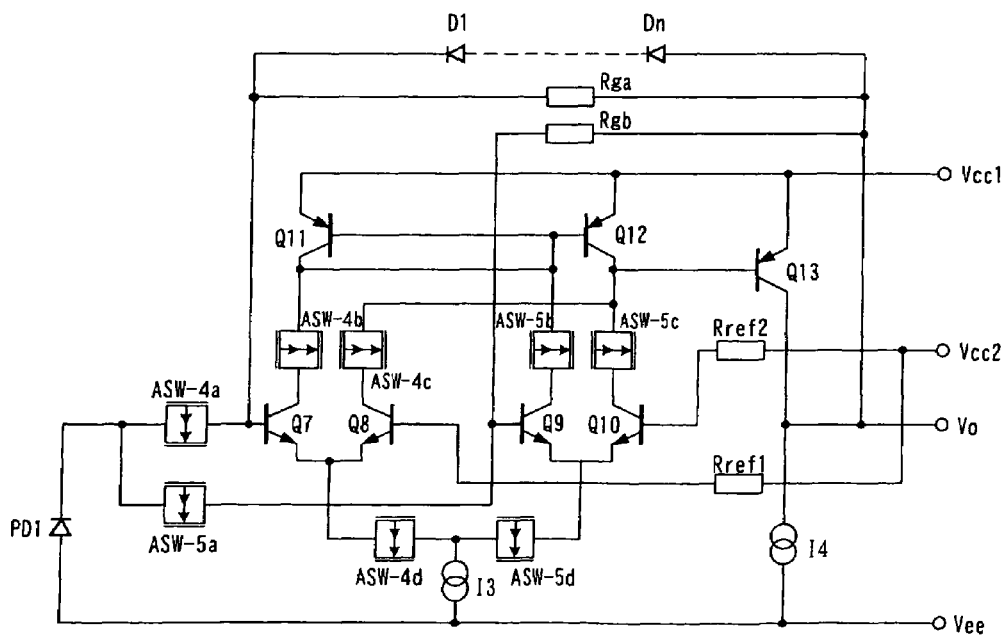
FIG. 6 is a circuit diagram showing a light-receiving amplifier circuit using diodes according to Embodiment 2 of the present invention.

As in Embodiment 1, since laser light power is high during recording, a clipping circuit is connected in many cases to prevent a circuit from being saturated. FIG. 6 is a circuit diagram showing still another light-receiving amplifier circuit of Embodiment 2. As shown in FIG. 6, n diodes D1 to Dn corresponding to a clipping voltage are connected in parallel with a gain resistance Rga, so that a gain configuration including a clipping circuit can be selected.

As in Embodiment 1, an NPN transistor QD1 may be connected to the diodes making up the clipping circuit.

According to Embodiment 2, in the differential amplifier circuit, the analog switches are inserted and connected to current operating points of the circuit. Thus, the influence of the on resistances of the analog switches can be reduced and the characteristics of the operational amplifier are less affected. Further, when the dynamic range of a light-receiving signal is adjusted by switching gain resistances, a displacement from a set value can be reduced, thereby designing a light-receiving amplifier circuit with excellent characteristics.

Moreover, it is possible to provide an operational amplifier circuit, in which the gain resistances Rga and Rgb are switched by the analog switches and an output offset voltage can be adjusted according to the resistance values of the gain resistances, and a light-receiving amplifier circuit using the same.

Embodiment 3

FIG. 7 is a circuit diagram showing a light-receiving amplifier circuit according to Embodiment 3 of the present invention. As shown in FIG. 7, a differential amplifier circuit comprises NPN transistors Q14 and Q15, PNP transistors Q16 and Q17, and a constant-current source I5. A PNP transistor Q18 and a constant-current source I6 are connected as an output stage. A reference resistance Rref1 corresponding to a gain resistance Rga is connected to the NPN transistor Q15, and a voltage source Vcc2 is connected to the other terminal of the reference resistance Rref1.

Analog switches ASW-6 and ASW-7 are connected to the outputs of two light-receiving elements PD1 and PD2, the other terminals of the analog switches ASW-6 and ASW-7 are connected to each other, and the terminals are connected to the input of an operational amplifier in which the gain resistance Rga is set. When the analog switch ASW-6 is turned on and the analog switch ASW-7 is turned off, the light-receiving element PD1 is in an operating state. Conversely, when the analog switch ASW-6 is turned off and the analog switch ASW-7 is turned on, the light-receiving element PD2 is in an operating state.

The light-receiving elements PD1 and PD2 may have either identical patterns and configurations or different patterns and configurations. In either case, signal processing can be performed with one operational amplifier by turning on/off the analog switches ASW-6 and ASW-7.

According to Embodiment 3, in the differential amplifier circuit, the analog switches are inserted and connected to current operating points of the circuit. Thus, it is possible to design a light-receiving amplifier circuit with excellent characteristics which can reduce the influence of the on resistances of the analog switches and influence on the characteristics of the operational amplifier.

Since the light-receiving elements PD1 and PD2 can be selected by turning on/off the analog switches, it is possible to select a light-receiving element with the most suitable configuration for uses of DVD/CD to obtain a light-receiving signal. Consequently, it is possible to remarkably improve the stability and quality of a light-receiving signal.

Embodiment 4

As shown in FIG. 8, a differential amplifier circuit comprises NPN transistors Q19 and Q20, PNP transistors Q21 and Q22, and a constant-current source I7. A reference resistance Rref1 is connected to the base of the NPN transistor Q20 which is an input on the reference voltage side of the differential amplifier circuit, analog switches ASW-8 and ASW-9 are connected to the other terminal of the reference resistance Rref1, and the other terminals of the analog switches ASW-8 and ASW-9 are connected to different voltage sources Vcc4 and Vcc5. When the analog switch ASW-8 is turned on and the analog switch ASW-9 is turned off, the reference voltage of the differential amplifier circuit is set at Vcc4. Conversely, when the analog switch ASW-8 is turned off and the analog switch ASW-9 is turned on, the reference voltage of the differential amplifier circuit is set at Vcc5.

The output dynamic range of a light-receiving amplifier circuit comprising the differential amplifier circuit can be changed by the reference voltages Vcc4 and Vcc5.

Figure 9:
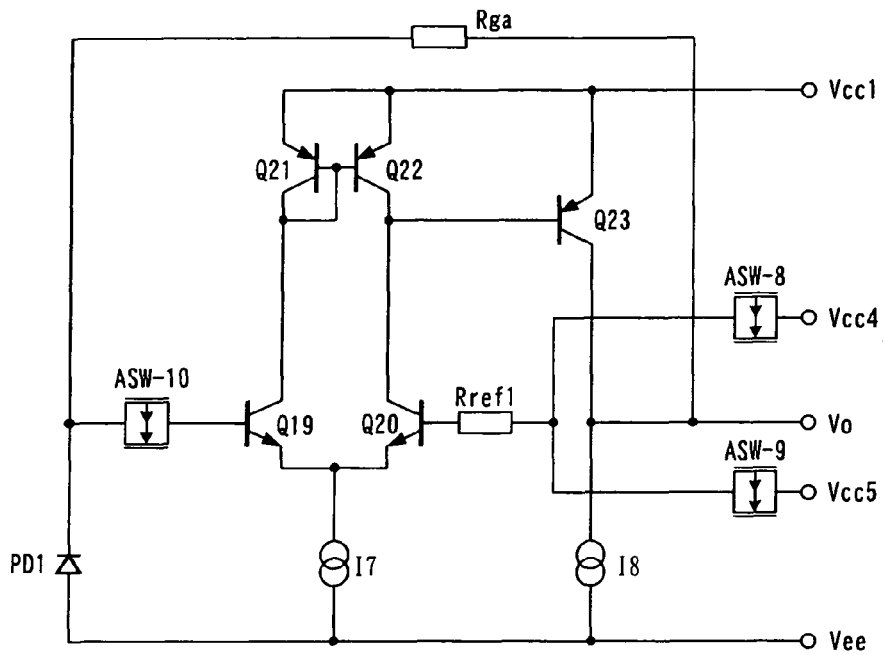
FIG. 9 is a circuit diagram showing another light-receiving amplifier circuit according to Embodiment 4 of the present invention.

A low voltage drop occurs on the analog switches ASW-8 and ASW-9 due to the base current of the NPN transistor Q20 and the on resistance of the analog switch ASW-8 or ASW-9. Hence, as shown in FIG. 9, an analog switch ASW-10 which is always turned on is inserted and connected to the base of the NPN transistor Q19 on the signal input side of the referential amplifier circuit, so that the low voltage drop is cancelled.

According to Embodiment 4, in the differential amplifier circuit, the analog switches are inserted and connected to current operating points of the circuit. Thus, it is possible to design a light-receiving amplifier circuit with excellent characteristics which can reduce the influence of the on resistances of the analog switches and influence on the characteristics of the operational amplifier.

As described above, the reference voltages can be selected by turning on/off the analog switches. Thus, it is possible to easily design a dynamic range and respond to needs for design changes, thereby improving the flexibility of the circuit.

Embodiment 5

Figure 10:
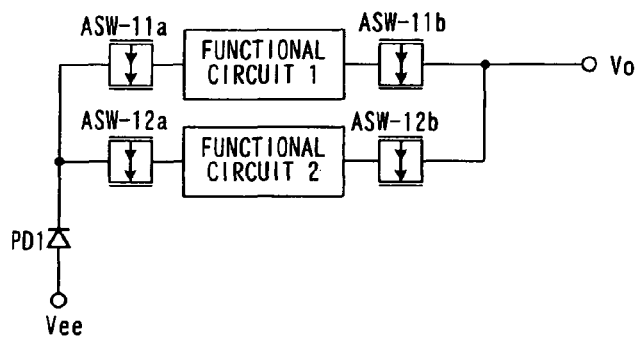
FIG. 10 is a circuit diagram showing a light-receiving amplifier circuit according to Embodiment 5 of the present invention.

As shown in FIG. 10, analog switches ASW-11a and ASW-12a are connected to the inputs of functional circuits 1 and 2, and analog switches ASW-11b and ASW-12b are connected to the outputs of the functional circuits 1 and 2. The other terminals of the analog switches ASW-11a and ASW-12a are connected to each other and a light-receiving element PD1 is connected to these terminals. The other terminals of the analog switches ASW-11b and ASW-12b are connected to each other and connected to an output terminal Vo.

When the analog switches ASW-11a and ASW-11b are turned on and the analog switches ASW-12a and ASW-12b are turned off, a signal from the light-receiving element PD1 can be subjected to signal processing in the functional circuit 1 and outputted to the output terminal Vo.

Conversely, when the analog switches ASW-11a and ASW-11b are turned off and the analog switches ASW-12a and ASW-12b are turned on, a signal from the light-receiving element PD1 can be subjected to signal processing in the functional circuit 2 and outputted to the output terminal Vo.

Figure 11:
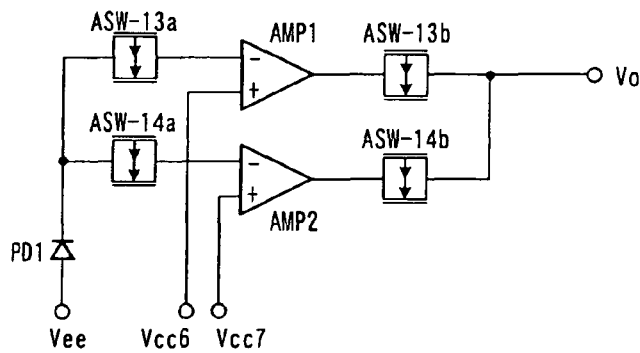
FIG. 11 is a circuit diagram showing another light-receiving amplifier circuit according to Embodiment 5 of the present invention.
Figure 12:
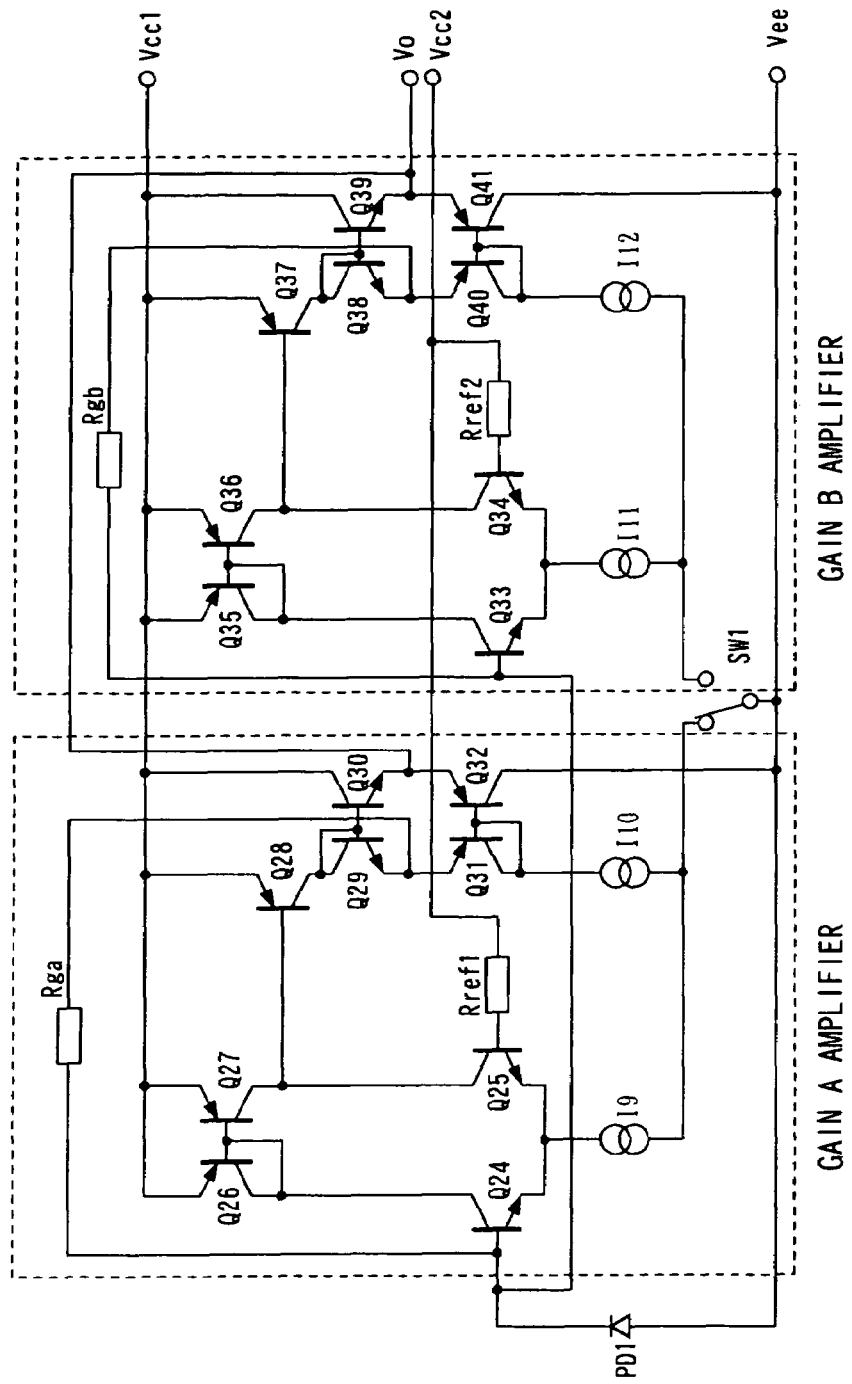
FIG. 12 is a circuit diagram showing a conventional light-receiving amplifier circuit.
Figure 13:
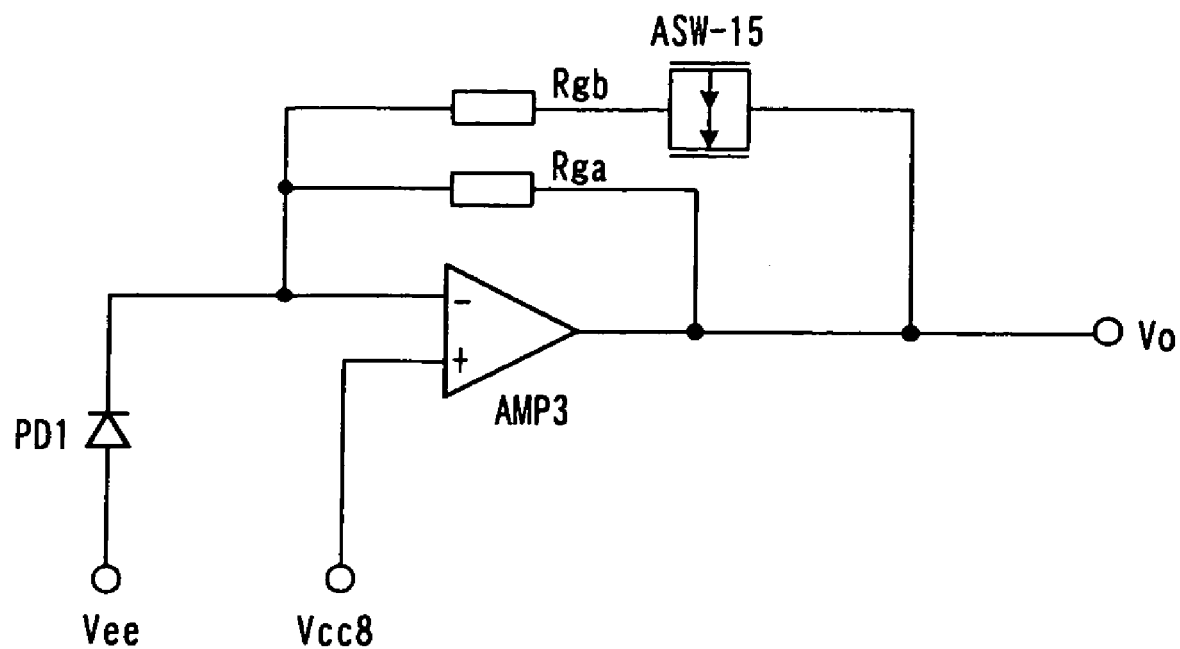
FIG. 13 is a circuit diagram showing a conventional light-receiving amplifier circuit using an analog switch.

As shown in FIG. 11, when the functional circuit 1 is an operational amplifier AMP1 and the functional circuit 2 is an operational amplifier AMP2, analog switches ASW-13a and ASW-13b are turned on and analog switches ASW-14a and ASW-14b are turned off, so that a signal from the light-receiving element PD1 can be subjected to signal processing in the operational amplifier AMP1 and outputted to the output terminal Vo. Conversely, when the analog switches ASW-13a and ASW-13b are turned off and the analog switches ASW-14a and ASW-14b are turned on, a signal from the light-receiving element PD1 can be subjected to signal processing in the operational amplifier AMP2 and outputted to the output terminal Vo.

According to Embodiment 5, in the differential amplifier circuit, the analog switches are inserted and connected to the current operating points of the circuit. Thus, it is possible to design a light-receiving amplifier circuit with excellent characteristics which can reduce the influence on the on resistances of the analog switches and influence on the characteristics of the operational amplifier.

As described above, the functional circuits can be selected by turning on/off the analog switches, thereby obtaining a circuit with a flexible design.

INDUSTRIAL APPLICABILITY

A differential amplifier circuit and an operational amplifier circuit of the present invention are useful, as function switching circuits using analog circuits, particularly for a light-receiving circuit or the like.

What is claimed is:

1. A differential amplifier circuit, comprising one or more first analog switches connected to each of a plurality of voltage sources for supplying a reference voltage to a first input section of the differential amplifier circuit, and a second analog switch connected to a second input section of the differential amplifier current, wherein
the reference voltage input to the first input section is selectable by switching the one or more of the first analog switches, and
wherein the second analog switch is always turned on.

2. The differential amplifier circuit according to claim 1, wherein each of the first and the second analog switches is a CMOS.

3. An operational amplifier circuit, comprising a gain resistance and an output section in the differential amplifier circuit according to claim 1.

4. A light-receiving amplifier circuit, comprising at least one or more light-receiving elements connected to one input of the operational amplifier circuit according to claim 3, the light-receiving element for converting an optical signal to an electrical signal.

5. The differential amplifier circuit according to claim 1, wherein the second analog switch has a predetermined on resistance.

* * * * *